United States Patent [19]
Ue et al.

[11] Patent Number: 5,733,661
[45] Date of Patent: Mar. 31, 1998

[54] HIGH-PERMITTIVITY COMPOSITE OXIDE FILM AND USES THEREOF

[75] Inventors: Makoto Ue; Fumikazu Mizutani; Takako Takahashi; Sachie Sekigawa, all of Ibaraki, Japan

[73] Assignee: Mitsubishi Chemical Corporation, Tokyo, Japan

[21] Appl. No.: 551,999

[22] Filed: Nov. 2, 1995

[30] Foreign Application Priority Data

| Nov. 11, 1994 | [JP] | Japan | 6-277841 |
| Nov. 11, 1994 | [JP] | Japan | 6-277842 |
| Nov. 11, 1994 | [JP] | Japan | 6-277843 |
| Nov. 11, 1994 | [JP] | Japan | 6-277844 |

[51] Int. Cl.$^6$ .................................................. B32B 15/00
[52] U.S. Cl. .................... 428/426; 428/428; 428/469; 428/472; 428/701; 428/702
[58] Field of Search .................................. 428/426, 428, 428/469, 472, 699, 701, 432; 420/702; 361/301.1, 321.4

[56] References Cited

FOREIGN PATENT DOCUMENTS 6-322588 11/1994 Japan.

*Primary Examiner*—Timothy Speer
*Attorney, Agent, or Firm*—Dilworth & Barrese

[57] ABSTRACT

A composite oxide film which comprises at least one oxide of a metal selected from the group consisting of Al, Ti, Zr, Hf, Nb, and Ta, said oxide containing ions of an organic carboxylic acid salt and/or ions of an inorganic oxoacid salt.

18 Claims, 8 Drawing Sheets

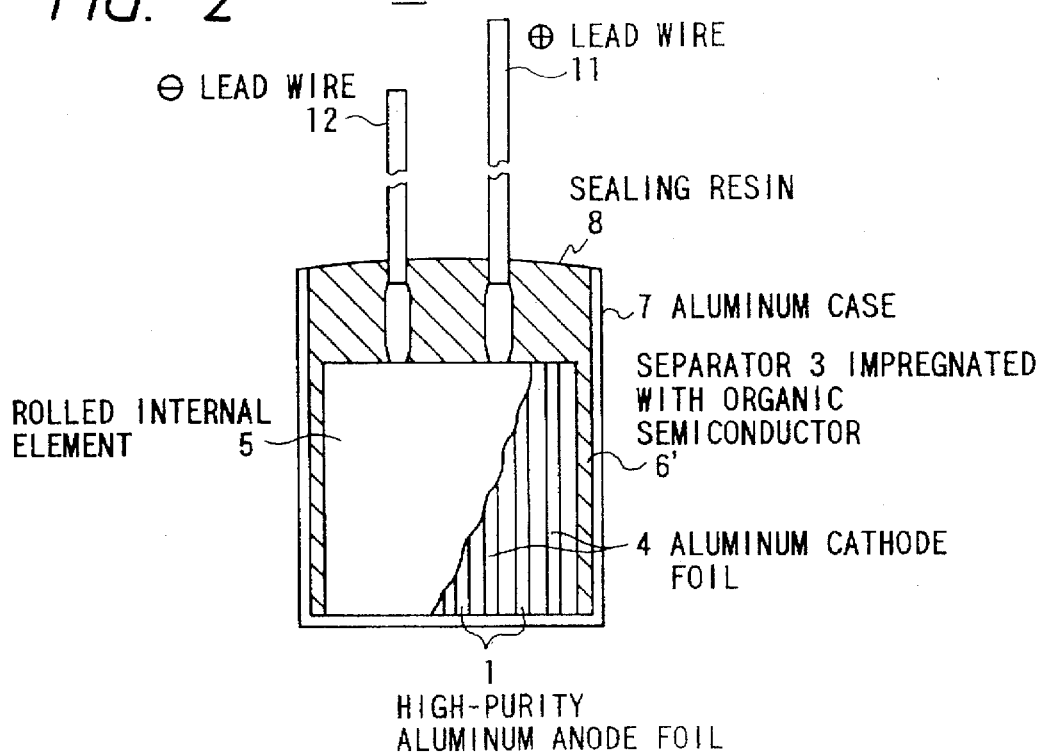
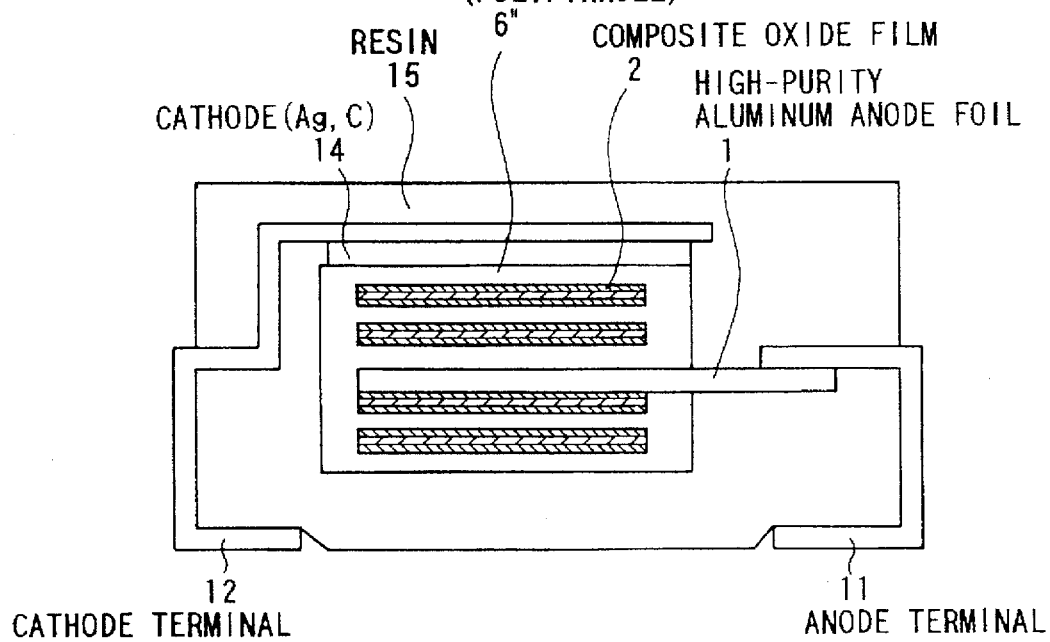

SOLID ELECTROLYTIC CAPACITOR 13
RESIN 15
ANODE TERMINAL 11
CAPACITOR ELEMENT 5
CATHODE TERMINAL 12

14 CATHODE (Ag, C)
6" SOLID ELECTROLYTE LAYER ($MnO_2$)
2 COMPOSITE OXIDE FILM
1' POROUS SINTER (ENLARGED SECTIONAL VIEW)

HIGH-PERMITTIVITY COMPOSITE OXIDE FILM AND USES THEREOF

FIELD OF THE INVENTION

The present invention relates to a high-permittivity composite oxide film and uses thereof. The composite oxide film of this invention is useful as a dielectric film for charge storage in, e.g., (1) electrolytic capacitors, (2) solid electrolytic capacitors, (3) thin-film capacitors, (4) semiconductor memories (DRAM), and (5) thin-film transistor liquid-crystal devices (TFT-LCD), as a wiring/electrode insulating film in, e.g., (6) semiconductor devices, liquid-crystal devices, and fluorescent display tubes, or as an insulator in (7) metal-insulator-metal (MIM) type liquid-crystal devices and MIM type electron-emitting cathode devices.

BACKGROUND OF THE INVENTION

Al, and metals such as Ti, Zr, Hf, Nb and Ta belonging to Groups IIIa, IVa, and Va (or Groups 3B, 4B, and 5B) are called valve metals. This is because the oxide films formed on these metals by anodizing the same in an electrolytic solution have the so-called valve action, i.e., they function to permit electric current to flow therethrough in one direction only. The anodization of valve metals is a technology long well known, and is industrially utilized in a wide range of fields. The aluminum oxide and tantalum oxide formed by anodization have such high electrical insulating properties that they are being used as the dielectric of aluminum electrolytic capacitors and tantalum electrolytic capacitors ("Kinzoku Hyōmen Gijutsu Binran (Handbook of Metal Surface Finishing), revised new edition," edited by Kinzoku Hyōmen Gijutsu Kyōkai (The Metal Surface Finishing Society of Japan), p. 671, Nikkan Kogyo Shinbun-sha (1976)). These oxides are also being used as an insulating protective film for wiring in, e.g., liquid-crystal devices, because the anodizing process can be performed at low temperatures to form an insulating film.

Anodization is usually carried out in an aqueous electrolytic solution, where the water serves as an oxygen source for a metal oxide ("Denki Kagaku Binran (Handbook of Electrochemistry), 4th ed.," edited by Denki Kagaku Kyōkai (The Electrochemical Society of Japan, p. 359, Maruzen (1985)). Aqueous solutions of either boric acid or a phosphoric acid salt are used in the production of aluminum electrolytic capacitors, while aqueous solutions of either phosphoric acid or nitric acid are used in the production of tantalum electrolytic capacitors (W. J. Bernard, *J. Electrochem. Soc.*, 124, 403C (1977)). Other electrolytic solutions in use include a tartaric acid solution for an insulating aluminum film (K. S. Chari et al., *Thin Solid Films*, 75, 157 (1981)) and a citric acid solution for an insulating tantalum film (D. R. Baraff et al., *Proceedings of the SID*, 22, 310 (1981)).

The electrostatic capacity, C, of a capacitor is defined by the equation:

$$C = \epsilon_o \epsilon_r A/d \tag{1}$$

where $\epsilon_o$ is permittivity in vacuum, $\epsilon_r$ is relative permittivity, A is area of the dielectric, and d is thickness of the dielectric ("Kinzoku Hyōmen Gijutsu Binran (Handbook of Metal Surface Finishing), revised new edition," edited by Kinzoku Hyōmen Gijutsu Kyōkai (The Metal Surface Finishing Society of Japan), p. 671, Nikkan Kogyo Shinbun-sha (1976)). Consequently, a capacitor having an increased electrostatic capacity is obtained by any of the following techniques: (a) use of a dielectric material having a higher relative permittivity; (b) use of a thinner dielectric, and (c) use of a dielectric having a larger surface area.

With respect to technique (a), it is known that the relative permittivities of oxides obtained by the anodizing process are almost the same (A. K. Vijh, *J. Mat. Sci. Lett.*, 7, 245 (1988)). In this reference, the following relative permittivity values are given for respective simple metal oxides. $Al_2O_3$: 11, $TiO_2$: 40, $ZrO_2$: 25, $HfO_2$: 22, $Nb_2O_5$: 41, $Ta_2O_5$: 28.

Since use of a material having a higher relative permittivity enables production of a capacitor with a larger electrostatic capacity, electrolytic capacitors employing valve metals other than Al and Ta are also being investigated (W. J. Bernard, *J. Electrochem. Soc.*, 124, 403C (1977)). With the recent increase in the capacity of semiconductor memories (DRAM), the conventional dielectric films made of $SiO_2$ (relative permittivity: 4) or $Si_3N_4$ (relative permittivity: 7) have become difficult to use in realizing memories of the next generation which have a storage capacity of 64 Mb, 1 Gb, etc. It has been proposed to use $Ta_2O_5$, which has a higher relative permittivity (S. G. Byeon et al., *J. Appl. Phys.*, 66, 4837 (1989)).

Technique (b) of dielectric thickness reduction should be discussed on the assumption that a constant withstand voltage is maintained, because reducing the thickness of an oxide film results in a decrease in withstand voltage. A practical technique for reducing the thickness of an aluminum oxide film while maintaining the same withstand voltage comprises performing a heat treatment before and after anodization to crystallize aluminum oxide (Nagata, "Aluminum Dry Electrolytic Capacitor," p. 232, Nippon Chikudenki Kogyo (1983)). Further, it has been reported in JP-A-5-343266 (the term "JP-A" as used herein means an "unexamined published Japanese patent application") and JP-A-5-343267 that by using a nonaqueous electrolytic solution as a forming electrolyte, an amorphous aluminum oxide film having a smaller thickness can be obtained while maintaining the same withstand voltage.

Technique (c) of employing a dielectric having an increased surface area is in wide use at present. For example, surface area enlargement for increasing electrostatic capacity has been accomplished by etching an anode aluminum foil in producing an aluminum electrolytic capacitor, by using a porous tantalum sinter in producing a tantalum electrolytic capacitor, or by employing a three-dimensional structure in producing a DRAM.

Since the oxides obtained by the anodizing process have almost the same relative permittivity, the thickness of an oxide film formed by anodization is generally determined from a measured value of electrostatic capacity using equation (1) given above (J. W. Diggle et al., *Chem. Rev.*, 365 (1969) and G. C. Wood et al., *Trans. Inst. Met. Fin.*, 45, 174 (1967)).

However, with the recent trend toward weight and size reduction in electronic appliances, it has become highly desirable to miniaturize electrolytic capacitors and produce them as chips. Thus, there is a desire for an electrolytic capacitor with an even larger electrostatic capacity.

The dielectric films on printed circuits or semiconductor circuits have the same requirement. In particular, in DRAM's of the next generation which have a storage capacity of 64 Kb or larger, use of a thin film of a material having a higher relative permittivity, e.g., $Ta_2O_5$, in place of the conventional $SiO_x$ or $SiN_x$ films is thought to be essential.

SUMMARY OF THE INVENTION

An object of the present invention is to provide a high-permittivity composite oxide film capable of satisfying such a requirement and to provide uses of the composite oxide film.

According to a first aspect of the present invention, a composite oxide film is provided which comprises an oxide of at least one metal selected from the group consisting of Al, Ti, Zr, Hf, Nb, and Ta, said oxide containing ions of an organic carboxylic acid salt and/or ions of an inorganic oxoacid salt, and which is preferably a high-permittivity composite oxide film having a relative permittivity at least twice the relative permittivity of the simple oxide of said metal.

According to a second aspect, the present invention provides an electrolytic capacitor, a solid electrolytic capacitor, a thin-film capacitor, a semiconductor memory (DRAM), a thin-film transistor liquid-crystal device (TFT-LCD), a wiring/electrode insulating film, and a metal-insulator-metal (MIM) type device each containing or comprising the composite oxide film described above.

BRIEF DESCRIPTION OF THE DRAWINGS

FIG. 2 illustrates the structure of an aluminum solid electrolytic capacitor containing an organic semiconductor as a solid electrolyte.

FIG. 3 illustrates the structure of an aluminum solid electrolytic capacitor containing a conductive polymer as a solid electrolyte.

DETAILED DESCRIPTION OF THE INVENTION

Figure 1A:
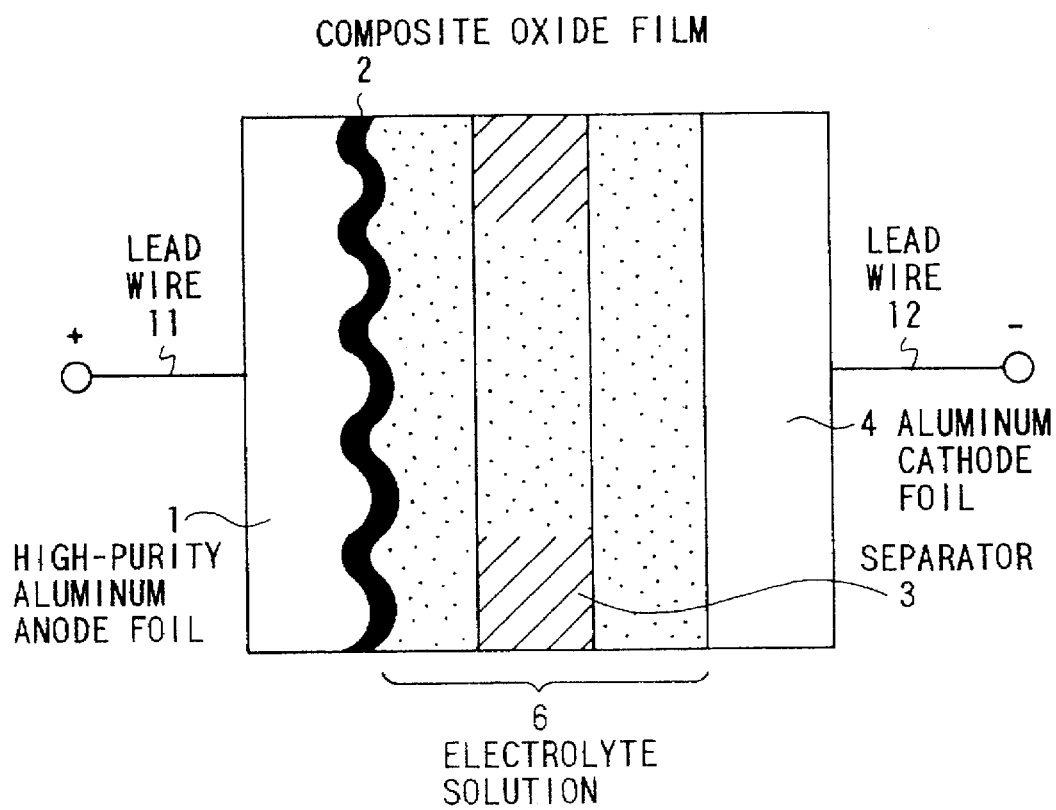
FIG. 1A and FIG. 1B illustrate the structure of an aluminum electrolytic capacitor containing an electrolytic solution.

The high-permittivity composite oxide film of the present invention is obtained by anodizing a metal selected from the group consisting of Al, Ti, Zr, Hf, Nb, and Ta in a substantially anhydrous nonaqueous electrolytic solution containing an organic carboxylic acid salt and/or an inorganic oxoacid salt.

In the anodization of a metal selected from the group consisting of Al, Ti, Zr, Hf, Nb, and Ta in a system containing no or little water, anions of the organic carboxylic acid salt and/or inorganic oxoacid salt as the solute of the electrolytic solution are uptaken into the oxide film in a large quantity as an oxygen source. As a result, a composite oxide film containing not only oxygen but the other constituent elements of the anions is formed, which has a relative permittivity as high as at least twice the relative permittivity of a film of the corresponding simple oxide.

In contrast to the established conventional theory that anodization is conducted using water as an oxygen source to yield a simple oxide film, the above-described anodization in an electrolytic solution system containing no or little water yields a high-permittivity composite oxide film whose composition and structure are novel and different from those of the ordinary simple oxide films, due to the presence of ions of an organic carboxylic acid salt and/or ions of an inorganic oxoacid salt.

The valve metal for use in this invention is basically a metal selected from the group consisting of Al, Ti, Zr, Hf, Nb, and Ta, but may be an alloy thereof. Although a metal having a purity as high as 4N (99.99 wt %) or higher is usually used, Al-1 wt % Si (consisting of 99 wt % Al and 1 wt % Si), Al-1 wt % Si-0.5 wt % Cu, Al-0.5 wt % Cu, Al-Ta alloys, and the like are also useful.

The metal may have any shape, e.g., a wire, rod, foil, or plate form. The metal may be an etched metal having an increased surface area, or may be a porous sinter. Also useful is a thin metal film formed on a substrate, e.g., a glass, ceramic, or semiconductor, by vacuum deposition, sputtering, CVD, etc.

The carboxylic acid from which the organic carboxylic acid salt is derived is preferably a lower carboxylic acid having 2 to 7 carbon atoms. Examples thereof include maleic acid, citraconic acid, oxalic acid, malonic acid, succinic acid, glutaric acid, adipic acid, and salicylic acid.

The oxoacid from which the inorganic oxoacid salt is derived may be an oxoacid having a non-metallic central element, e.g., nitrogen, phosphorus, or boron, such as nitric acid, phosphoric acid, or boric acid, or may be an oxoacid having a metallic central element, e.g., vanadium, chromium, molybdenum, or tungsten, such as vanadic acid, chromic acid, molybdic acid, or tungstic acid. The oxoacid may be a polyacid, which may be an isopolyacid or a heteropolyacid.

Examples of the cation as the other component of the organic carboxylic acid salt and/or inorganic oxoacid salt include alkali metal ions, primary, secondary, tertiary, and quaternary ammonium ions, quaternary phosphonium ions, and sulfonium ions.

The organic carboxylic acid salts and inorganic oxoacid salts described above may be used in combination of two or more thereof.

Examples of useful nonaqueous solvents include polar solvents such as alcohol solvents, e.g., ethylene glycol and methyl Cellosolve; lactone solvents, e.g., γ-butyrolactone, γ-valerolactone, and δ-valerolactone; carbonate solvents, e.g., ethylene carbonate, propylene carbonate, and butylene carbonate; amide solvents, e.g., N-methylformamide, N-ethylformamide, N,N-dimethylformamide, N,N-diethylformamide, N-methylacetamide, N,N-dimethylacetamide, and N-methylpyrrolidinone; nitrile solvents, e.g., 3-methoxypropionitrile and glutaronitrile; phosphoric ester solvents, e.g., trimethyl phosphate and triethyl phosphate; and mixtures of two or more of these solvents. Examples thereof further include nonpolar solvents such as hexane, toluene, and silicone oils. Preferred are solvents in which the organic carboxylic acid salt and/or inorganic oxoacid salt is well soluble.

The amount of the organic carboxylic acid salt and/or inorganic oxoacid salt dissolved in the solvent varies depending on the desired electrolytic conductivity and scintillation voltage of the electrolytic solution to be obtained. In general, however, the salt is dissolved in an amount not greater than the solubility (saturation concentration) thereof, preferably at a concentration of from 0.1 to 2 mol/l. In the case where the solute itself is a molten salt, the anodization may be conducted without a solvent.

The nonaqueous electrolytic solution for use in producing the composite oxide film of the present invention is substantially anhydrous. Although use of an electrolytic solution which is anhydrous to the highest degree is desirable, a "substantially anhydrous" electrolytic solution is used for producing the composite oxide film because inclusion of a slight amount of water during handling is unavoidable. If a completely anhydrous electrolytic solution is used, an anodizing reaction in which anions serve as an oxygen source proceeds. In the case where a slight amount of water is present, anodizing reactions in which anions and water both serve as an oxygen source proceed simultaneously. If the water concentration exceeds a certain value, an ordinary anodizing reaction in which water only serves as an oxygen source proceeds. Thus, the water and the anions both serving as an oxygen source undergo competitive reactions. The acceptable water concentration limit therefore depends considerably on anodizing conditions (e.g., the nature of the electrolytic solution, the concentration and temperature of the electrolytic solution, current density, voltage, the shape of the electrolytic cell, and whether stirring is conducted or not), and cannot be specified unconditionally. However, in the case where anodization is conducted under ordinary conditions including, e.g., a concentration of 1 mol/l, room temperature, 5 mA/cm$^2$, 50 V, and an electrode distance of 2 cm, the water amounts in an electrolytic solution based on γ-butyrolactone solvent and in an electrolytic solution based on ethylene glycol solvent are about 0.025 g or smaller and about 1.25 g or smaller, respectively, per unit area (cm$^2$) of the electrode. Electrolytic solutions having higher viscosities have higher acceptable water concentration limits. The acceptable water concentration limit becomes higher as the concentration of the electrolytic solution becomes higher, as the temperature becomes lower, as the current density becomes higher, as the voltage becomes higher, and as the electrolytic cell becomes larger.

In general, anodization is carried out in the electrolytic bath at a temperature of from room temperature to 150° C. and at a current density of from 0.5 to 50 mA/cm$^2$. The time for this anodization is determined by the electrode area and the formation voltage (film thickness).

By the method described above, a composite oxide film can be obtained which comprises at least one oxide of a metal selected from the group consisting of Al, Ti, Zr, Hf, Nb, and Ta, contains ions of an organic carboxylic acid salt and/or ions of an inorganic oxoacid salt, and preferably has a relative permittivity as high as at least twice the relative permittivity of the simple oxide of the metal. The amount of the ions of an organic carboxylic acid salt and/on inorganic oxoacid salt contained in this composite oxide film is from 1 to 50% by weight in terms of the content of the central element of the ions (e.g., the central element of ions of an organic carboxylic acid salt is carbon, and that of ions of a vanadic acid salt is vanadium).

The high-permittivity composite oxide film of the present invention may be modified so as to have different film properties by performing a heat treatment before and after the anodization.

The simple oxides of Al, Ti, Zr, Hf, Nb, and Ta which oxides are referred to herein in comparison with the high-permittivity composite oxide films of this invention are $Al_2O_3$, $TiO_2$, $ZrO_2$, $HfO_2$, $Nb_2O_5$, and $Ta_2O_5$, respectively, whose relative permittivities are 11, 40, 25, 22, 41, and 28, respectively, as stated hereinabove.

According to the present invention, composite oxide films having a high permittivity are obtained. The relative permittivity of the composite oxide film is at least twice, preferably 2.5 times the relative permittivity of simple oxide films. Specifically, the relative permittivity of the composite aluminum oxide film is from 22 to 1,000, preferably from 30 to 400, especially from 70 to 300, that of the composite titanium oxide film is from 80 to 1,000, preferably from 100 to 300, that of the composite zirconium oxide film is from 50 to 1,000, preferably from 150 to 400, that of the composite hafnium oxide film is from 44 to 1,000, preferably from 100 to 300, that of the composite niobium oxide film is from 82 to 1,000, preferably from 100 to 700, and that of the composite tantalum oxide film is from 56 to 1,000, preferably from 70 to 300.

The film thickness varies depending on the nature of the valve metal and the nature and concentration of the electrolytic solution. In general, however, the film thickness is from 10 to 1,000 nm.

Application examples for this high-permittivity composite oxide film are explained below.

First, by use of the high-permittivity composite oxide film of this invention as a dielectric, various capacitors having the same shapes as conventional capacitors but having a larger electrostatic capacity can be obtained.

(1) Electrolytic Capacitor

Figure 1B:
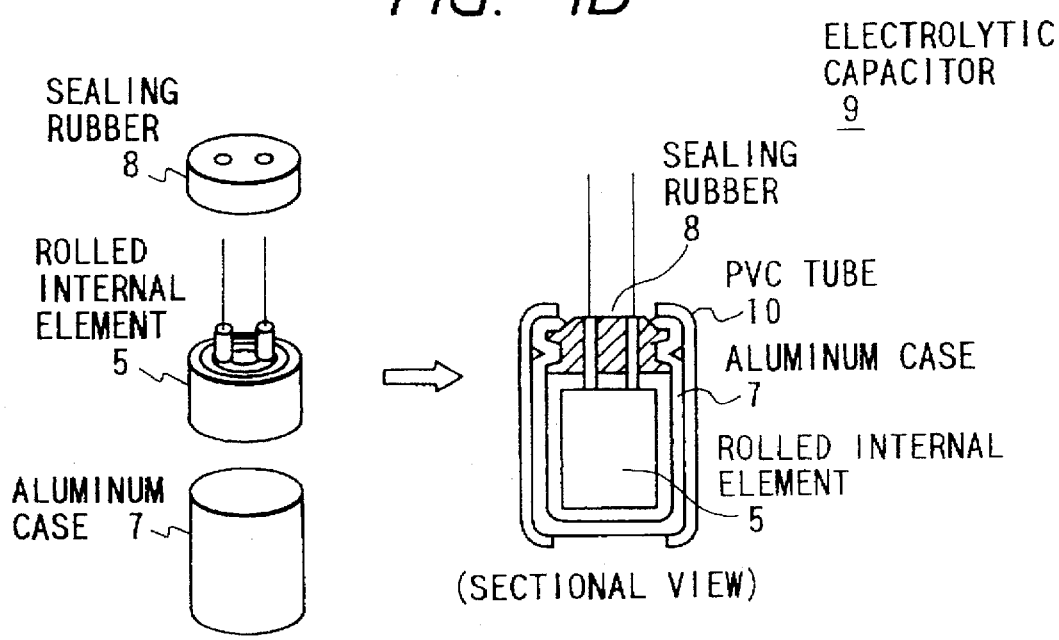

In FIG. 1A and FIG. 1B is illustrated the structure of an aluminum electrolytic capacitor containing an electrolytic solution. This electrolytic capacitor of the present invention can be produced by the same method as for conventional electrolytic capacitors of this type, except that a high-permittivity composite oxide film is formed on a surface of a metal foil, e.g., an etched aluminum foil, by anodization. Specifically, this capacitor is produced as follows. A high-purity aluminum foil 1 is etched to enlarge the surface area thereof, before a high-permittivity composite oxide film 2 is formed on the etched surface by the method described above. This aluminum foil 1 is wound into a roll together with a separator 3 and an aluminum cathode foil 4 to obtain an internal capacitor element 5. This element 5 is impregnated with an electrolytic solution 6 and then placed in an aluminum case 7, which is sealed with a sealing rubber 8 to produce an electrolytic capacitor 9. In FIG. 1A and FIG. 1B, numeral 10 denotes a tube made of polyvinyl chloride and 11 and 12 each denotes a lead wire. Details of this production method are as described in Nagata, "Aluminum Dry Electrolytic Capacitor," Nippon Chikudenki Kogyo (1983).

(2) Solid Electrolytic Capacitor

In FIG. 2 is illustrated the structure of an aluminum solid electrolytic capacitor containing an organic semiconductor, e.g., a TCNQ (tetracyanoquinodimethane) salt, as a solid electrolyte. This solid electrolytic capacitor 13 of the present invention can be produced by the same method as for conventional solid electrolytic capacitors of this type, except that a high-permittivity composite oxide film is formed on a surface of a metal foil, e.g., an etched aluminum foil, by anodization. Specifically, this capacitor is produced by a method comprising infiltrating a thermally molten organic semiconductor 6' into a rolled internal element 5 produced in the manner described in (1) above. The numerals denoted in FIG. 2 have the same meanings as those denoted in FIG. 1. Details of this production method are as described in Ezaki et al., *Denki Kagaku* (Electrochemistry), Vol. 58, p. 794

(1990). Manganese dioxide obtained by infiltrating manganese nitrate and pyrolyzing the same may be used as a solid electrolyte in place of the organic semiconductor 6'; details of this production method are as described in Ikeda, *Jitsumu Hyōmen Gijutsu* (Practical Surface Technology), Vol. 35, p. 261 (1988).

In FIG. 3 is illustrated the structure of an aluminum solid electrolytic capacitor containing a conductive polymer, e.g., polypyrrole, as a solid electrolyte. This solid electrolytic capacitor 13 of the present invention can be produced by the same method as for conventional solid electrolytic capacitors of this type, except that a high-permittivity composite oxide film 2 is formed on a surface of a metal foil 1, e.g., an etched aluminum foil, by anodization. Specifically, this capacitor is produced as follows. A high-purity aluminum foil 1 is etched to enlarge the surface area thereof, before a high-permittivity composite oxide film 2 is formed on the etched surface by the method described hereinabove. A solid electrolyte layer 6" made of polypyrrole is then formed by, e.g., chemical polymerization or electrolytic polymerization. Thereafter, a carbon and silver paste are applied to form a cathode 14, and the resulting structure is sealed with a resin 15 to obtain a solid capacitor 13. In FIG. 3, numerals 11 and 12 denote an anode terminal and a cathode terminal, respectively. Details of this production method are as described in Isa et al., *Denki Kagaku* (Electrochemistry), Vol. 58, p. 604 (1990) and Kudō et al., *Denki Kagaku* (Electrochemistry), Vol. 61, p. 240 (1993).

Figure 4A:
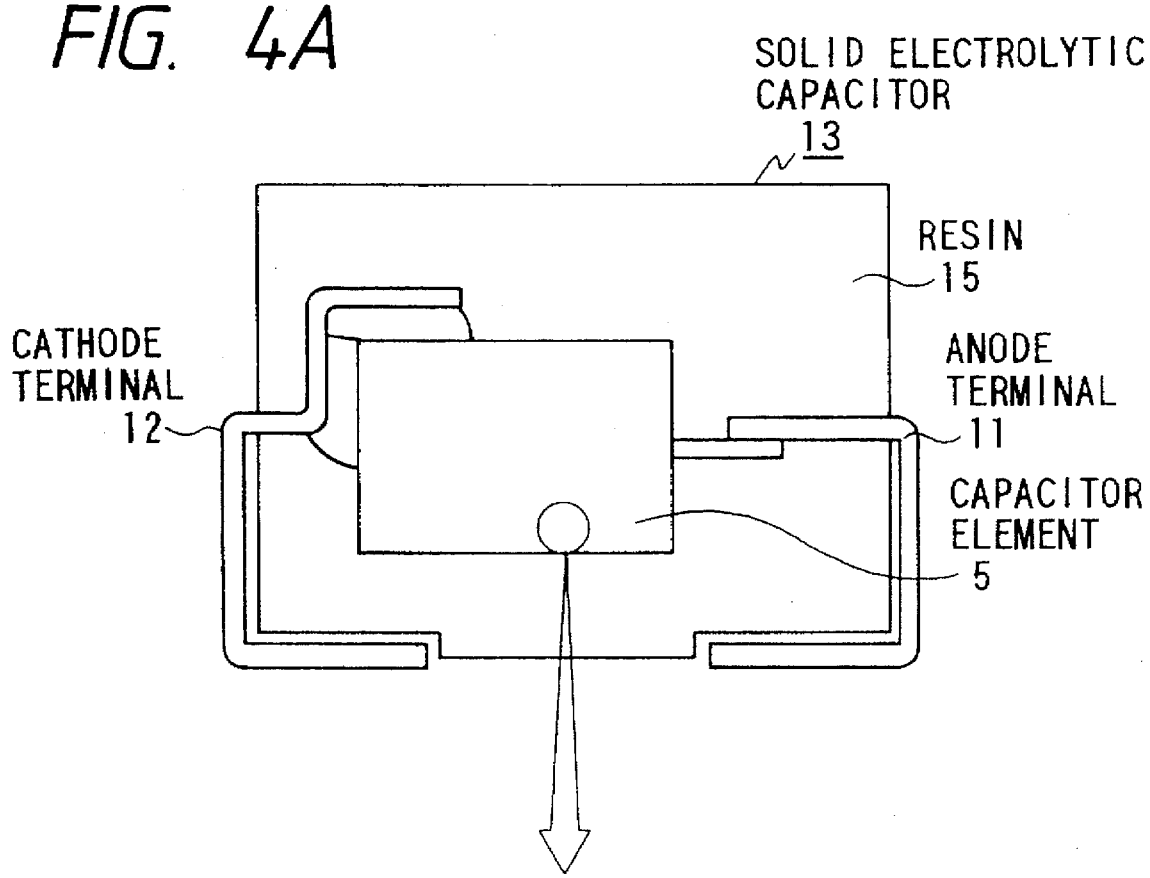
FIG. 4A and FIG. 4B illustrate the structure of a tantalum solid electrolytic capacitor containing manganese dioxide as a solid electrolyte.
Figure 4B:
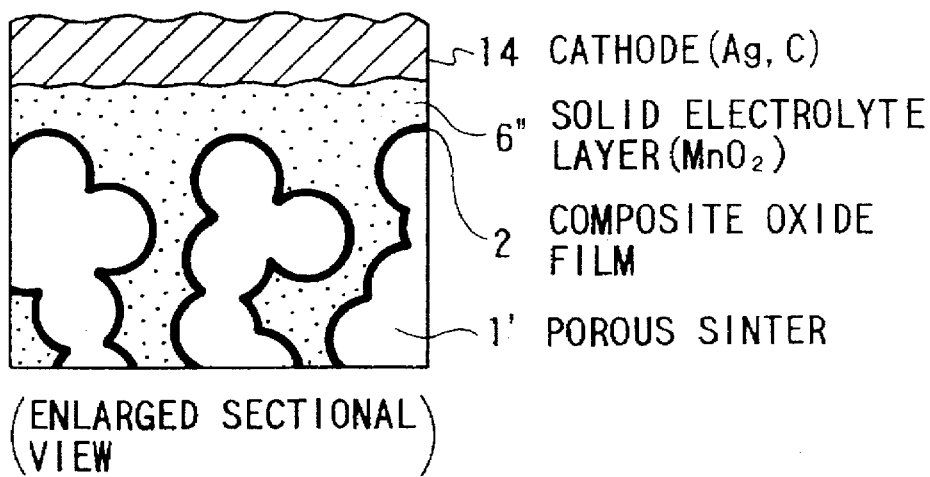

In FIG. 4A and FIG. 4B is illustrated the structure of a tantalum solid electrolytic capacitor 13 according to the present invention which contains a porous metal sinter as an anode. FIG. 4B is an enlarged sectional view of a capacitor element 5 illustrated in FIG. 4A. This solid electrolytic capacitor of the present invention can be produced by completely the same method as for conventional solid electrolytic capacitors of this type, except that a high-permittivity composite oxide film 2 is formed on the surface of a porous sinter 1' of a metal, e.g., aluminum or tantalum, by anodization. Specifically, this capacitor is produced as follows. A high-permittivity composite oxide film 2 is formed on the surface of a porous sinter 1' made of, e.g., tantalum or aluminum by the method described hereinabove, and a solid electrolyte layer 6" made of manganese dioxide is formed thereon by the pyrolysis of manganese nitrate. Thereafter, a carbon and silver paste are applied to form a cathode 14. In FIG. 4A, numerals 11 and 12 denote an anode terminal and a cathode terminal, respectively, numeral 5 denotes a capacitor element and numeral 15 denotes a resin. Details of this production method are as described in Kat ō, *Denki Kagaku* (Electrochemistry), Vol. 58, p. 788 (1990). In place of manganese dioxide, polypyrrole obtained by chemical polymerization or electrolytic polymerization may be used as a solid electrolyte; details of this production method are as described in Ikeda, *Jitsumu Hyōmen Gijutsu* (Practical Surface Technology), Vol. 35, p. 261 (1988).

(3) Thin-film Capacitor, Semiconductor Memory (DRAM), and Thin-film Transistor Liquid-crystal Device (TFT-LCD)

Figure 5:
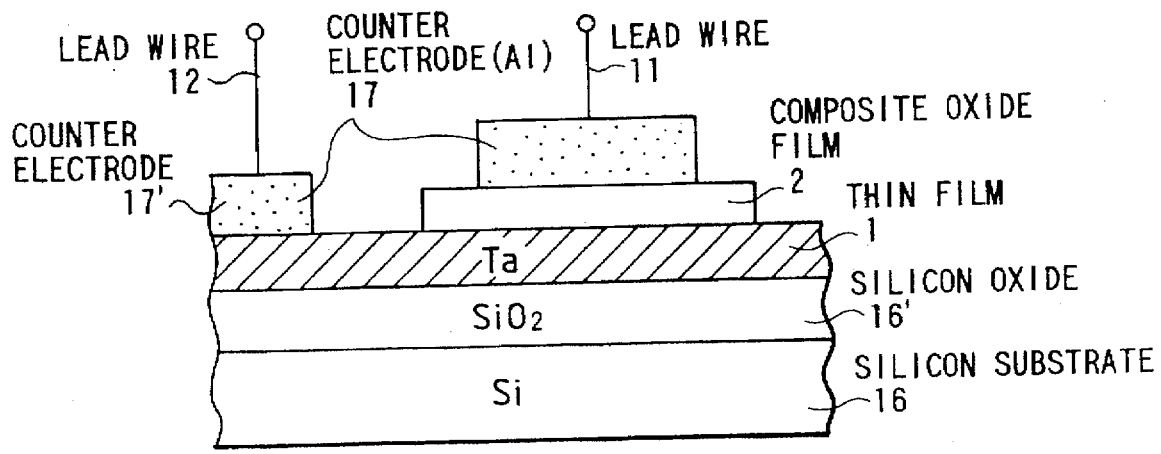
FIG. 5 illustrates the cell structure of a semiconductor memory (DRAM).

In FIG. 5 is illustrated the cell structure of a DRAM containing a high-permittivity composite oxide film according to the present invention. Tantalum or aluminum is sputtered on the surface of a silicon oxide 16' formed on a silicon substrate 16 by thermal oxidation to form a thin film 1, and a high-permittivity composite oxide film 2 is then formed by anodization. Thereafter, a counter electrode 17, 17' made of, e.g., gold or aluminum, is formed by vapor deposition to fabricate a sandwich structure. Lead wires 11 and 12 are attached to the electrodes to produce a DRAM 18.

A precise pattern can be produced by the same method as in the fabrication of a conventional semiconductor memory using a resist material. Details of this production method are as described in Jinriki, *Ōyō Butsuri* (Applied Physics), Vol. 60, p. 1115 (1991).

Substrate 16 may be an inorganic glass, an organic film, or a printed board. In this case, a thin-film capacitor is obtained.

The structure described above is also useful as a storage capacity electrode in a thin-film transistor liquid-crystal device.

In the case of using the composite oxide film of this invention as an insulator, applications thereof include the following.

(4) Wiring/Electrode Insulating Film

Figure 6:
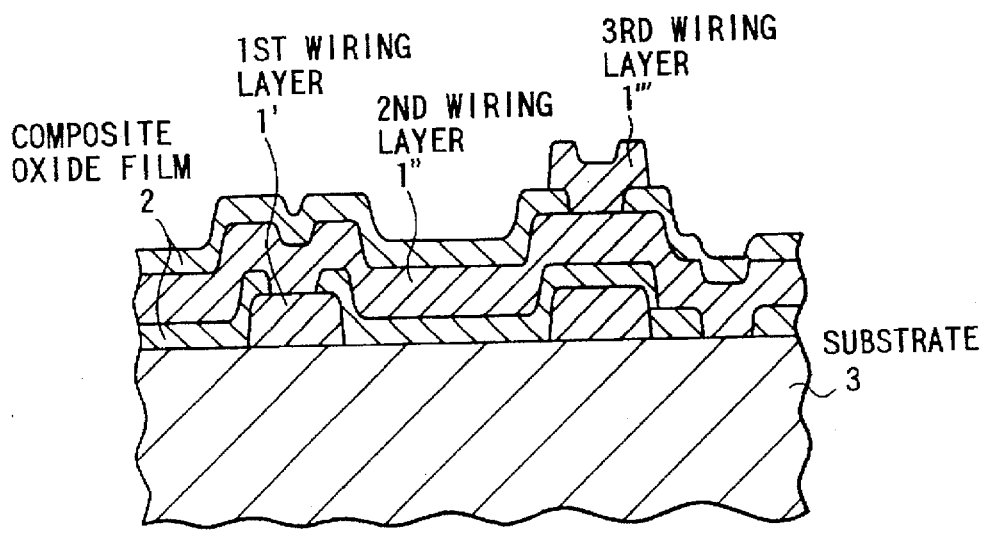
FIG. 6 is a sectional view of a multilayer wiring structure in an IC.

FIG. 6 is a sectional view of a multilayer wiring structure in an IC (integrated circuit) containing an insulating film according to the present invention. This insulating film of the present invention can be produced by completely the same method as for conventional insulating protective films, except that a high-permittivity composite oxide film 2 is formed by anodization on the surface of a wiring layer 1', 1", 1"' made of, e.g., an aluminum alloy. In FIG. 6, numeral 3 denotes a substrate. Details of this method are as described in Kamoshida, *Denki Kagaku* (Electrochemistry), Vol. 44, p. 491 (1976).

The insulating film is also useful as an insulating film for a metal-oxide-semiconductor (MOS) structure on a semiconductor device.

(5) Metal-Insulator-Metal (MIM) Device

Figure 7:
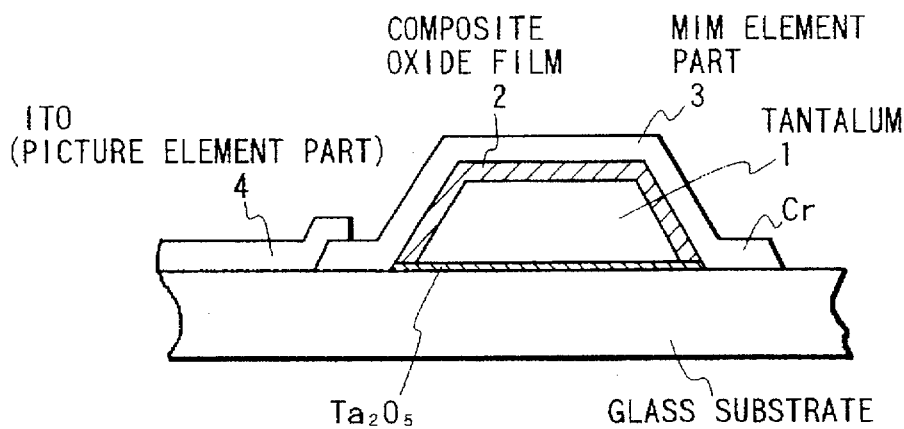
FIG. 7 illustrates the structure of an MIM-LCD.

In FIG. 7 is illustrated the structure of an MIM-LCD. The insulating film of the present invention can be produced by completely the same method as in conventional MIM-LCD's, except that a high-permittivity composite oxide film 2 is formed by anodization on an electrode made of, e.g., tantalum 1. In FIG. 7, numeral 3 denotes an MIM element part and numeral 4 denotes a picture element part. Details of this method are as described in Morozumi, *Television Gakkai-shi* (Journal of Television Society), Vol. 40, p. 980 (1986).

The present invention will be explained below in more detail by reference to the following Examples and Comparative Examples.

EXAMPLE 1

A γ-butyrolactone solution (GBL) containing triethylmethylammoniumhydrogen maleate at a concentration of 1 mol/l (M) was dehydrated by heating under reduced pressure. This dehydrated electrolytic solution had a water concentration of about 100 ppm. Into a cylindrical aluminum vessel having an inner diameter of 4 cm was introduced 100 ml of the electrolytic solution inside a glove box. A 4N (purity, 99.99%) aluminum foil having a smooth surface with a size of 2 cm by 5 cm and a thickness of 100 μm was anodized to 75 V at a constant current of 5 mA/cm$^2$ in the vessel to obtain an anodized foil (the water amount in this electrolytic solution was about 0.0005 g per cm$^2$ of the electrode). Examination of a section of this anodized foil with a TEM (transmission electron microscope) revealed that the oxide film had an almost smooth surface with almost the same surface area as the unanodized foil, and that the film thickness was about 80 nm. The anodized foil obtained was immersed in a 10 wt % aqueous solution of ammonium adipate to measure the electrostatic capacity of the oxide film with an LCR meter at 120 Hz. As a result, the electrostatic capacity of the film was found to be 2.98 μF/cm$^2$. The relative permittivity of the oxide film was 270, which was determined from that value of electrostatic capacity and the film thickness.

The oxide film was peeled from the aluminum substrate and subjected to elemental analysis. As a result, the oxide film was found to have a carbon content of about 20% by weight. Inclusion of maleate ions was ascertained by liquid chromatography.

COMPARATIVE EXAMPLE 1

An aluminum foil having a smooth surface was anodized in the same manner as in Example 1, except that as the forming electrolyte, use was made of 10 wt % aqueous ammonium adipate solution, which is in use for producing anodized foils for use in aluminum electrolytic capacitors. The thickness and electrostatic capacity of the resulting oxide film were measured, and found to be 110 nm and 0.09 $\mu F/cm^2$, respectively. From these values of electrostatic capacity and film thickness, the relative permittivity of the oxide film was calculated to be 11.

The oxide film was peeled from the aluminum substrate and subjected to elemental analysis. As a result, the oxide film was found to have a carbon content of 0.8% by weight or lower.

EXAMPLES 2 TO 8

Anodized foils were obtained by anodizing an aluminum foil having a smooth surface under the same conditions as in Example 1, except that the nature (and concentration) of the solute were varied. The solutes used were: tetraethylammonium hydrogen citraconate (Example 2), 0.1M-tetraethylammonium hydrogen oxalate (Example 3), tetraethylammonium hydrogen malonate (Example 4), 0.5M-tetraethylammonium hydrogen succinate (Example 5), tetraethylammonium hydrogen glutarate (Example 6), tetraethylammonium hydrogen adipate (Example 7), and tetraethylammonium salicylate (Example 8). The relative permittivities of the thus-obtained oxide films were determined in the same manner as in Example 1, and are shown in Table 1.

Each of the oxide films was peeled from the aluminum substrate and subjected to elemental analysis. As a result, the oxide films were found to have a carbon content of about from 5 to 20% by weight.

EXAMPLES 9 TO 11

Anodized foils were obtained by anodizing an aluminum foil having a smooth surface in the same manner as in Example 1, except that the forming electrolyte was replaced with a solution of tetraethylammonium hydrogen maleate in propylene carbonate (PC) (Example 9), a solution of ammonium hydrogen maleate in ethylene glycol (EG) (Example 10), or a solution of tetraethylammonium salicylate in propylene carbonate (Example 11, where the formation voltage was 50 V). The relative permittivity of the thus-obtained oxide films were determined in the same manner as in Example 1, and are shown in Table 1.

EXAMPLE 12

An ethylene glycol solution containing tetraethylammonium vanadate at a concentration of 1 mol/l was dehydrated by heating under reduced pressure. This dehydrated electrolytic solution had a water concentration of 0.9% by weight. Into a cylindrical aluminum vessel having an inner diameter of 4 cm was introduced 100 ml of the electrolytic solution inside a glove box. A 4N aluminum foil having a smooth surface with dimensions of 2 cm by 5 cm and a thickness of 100 μm was anodized to 60 V at a constant current of 5 $mA/cm^2$ in the vessel to obtain an anodized foil (the water amount in this electrolytic solution was about 0.045 g per $cm^2$ of the electrode). Examination of a section of this anodized foil with a TEM revealed that the oxide film had an almost smooth surface and a thickness of about 110 nm. The anodized foil obtained was immersed in a 10 wt % aqueous solution of ammonium adipate to measure the electrostatic capacity of the oxide film with an LCR meter at 120 Hz. As a result, the electrostatic capacity of the film was found to be 0.81 $\mu F/cm^2$. The relative permittivity of the oxide film was 100, which was determined from the value of electrostatic capacity and the film thickness.

The structure of this oxide film was analyzed by examination with an FESTEM (field emission scanning transmission electron microscope) and by EDX (energy-dispersive X-ray spectrometry).

Figure 8:
FIG. 8 is a view showing the structure of a section of the high-permittivity composite oxide film obtained in Example 12; in the figure, symbols 1 to 4 indicate the points where elemental analysis by EDX (energy dispersive X-ray spectrometry) was conducted.

FIG. 8 is a sectional view obtained with the FESTEM. The points indicated by numerals 1 to 3 in the section shown in FIG. 8 were subjected to elemental analysis by EDX. As a result, the atomic proportions for each point were as follows.

1 (O; 75.30%, Al; 22.15%, V; 2.55%),
2 (O; 73.69%, Al; 25.08%, V; 1.23%),
3 (O; 69.44%, Al; 29.38%, V; 1.18%).

It was thus ascertained that the oxide film contained vanadate anions.

COMPARATIVE EXAMPLE 2

An aluminum foil having a smooth surface was anodized to 50 V in the same manner as in Example 12, except that a 1-mol/l aqueous solution of tetraethylammonium vanadate was used as a forming electrolyte. The thickness and electrostatic capacity of the resulting oxide film were measured, and found to be 80 nm and 0.09 $\mu F/cm^2$, respectively. From these values of electrostatic capacity and film thickness, the relative permittivity of the oxide film was calculated to be 11, which was equal to the relative permittivity of the oxide film obtained in Comparative Example 1.

EXAMPLES 13 TO 17

Anodized foils were obtained by anodizing an aluminum foil having a smooth surface under the same conditions as in Example 12, except that the nature of the solute, water amount, and formation voltage were varied. The solute, water amount, and formation voltage used were: tetraethylammonium nitrate, 0.00008 $g/cm^2$, and 50 V (Example 13); tetraethylammonium borate, 0.0025 $g/cm^2$, and 38 V (Example 14); tetraethylammonium phosphate, 0.002 $g/cm^2$, and 25 V (Example 15); tetraethylammonium chromate, 0.03 $g/cm^2$, and 75 V (Example 16); and tetraethylammonium tungstate, 0.05 $g/cm^2$, and 30 V (Example 17). The relative permittivities of the thus-obtained oxide films were determined in the same manner as in Example 11, and are shown in Table 2.

Each of the oxide films was peeled from the aluminum substrate and subjected to elemental analysis. As a result, those composite oxide films were found to contain N, B, P, Cr, and W, respectively, in an amount of from 1 to 10% by weight.

EXAMPLE 18

A γ-butyrolactone solution containing triethylmethylammonium hydrogen maleate at a concentration of 1 mol/l was dehydrated by heating under reduced pressure. This dehydrated electrolytic solution had a water concentration of about 100 ppm. Into a cylindrical aluminum vessel having an inner diameter of 4 cm was introduced 100 ml of the electrolytic solution inside a glove box. A titanium foil having a smooth surface with dimensions of 1 cm by 1 cm was anodized to 50 V at a constant current of 5 mA/cm$^2$ in the vessel to obtain an anodized foil (the water amount in this electrolytic solution was about 0.005 g per cm$^2$ of the electrode).

Using a 10 wt % aqueous solution of ammonium adipate as a forming electrolyte, anodization was conducted in the same manner. Thus, an anodized foil having a conventional oxide film was also obtained.

Each of the thus-obtained anodized foils was immersed in a 10 wt % aqueous solution of ammonium adipate to measure the electrostatic capacity of the oxide film with an LCR meter at 120 Hz. As a result, the electrostatic capacity of the composite oxide film according to this invention and that of the conventional TiO$_2$ film were found to be 10 μF/cm$^2$ and 2.9 μF/cm$^2$, respectively. Thus, the electrostatic capacity of the film of this invention was 3.4 times the electrostatic capacity of the conventional film. This improvement ratio is equal to the ratio of the relative permittivity of the oxide film of this invention to that of the conventional oxide film, based on the assumption that the two films have the same thickness and the same surface area. Consequently, from the relative permittivity, 40, of the conventional oxide film, the relative permittivity of the oxide film of this invention was calculated at 140. The results obtained are shown in Table 3.

Figure 9:
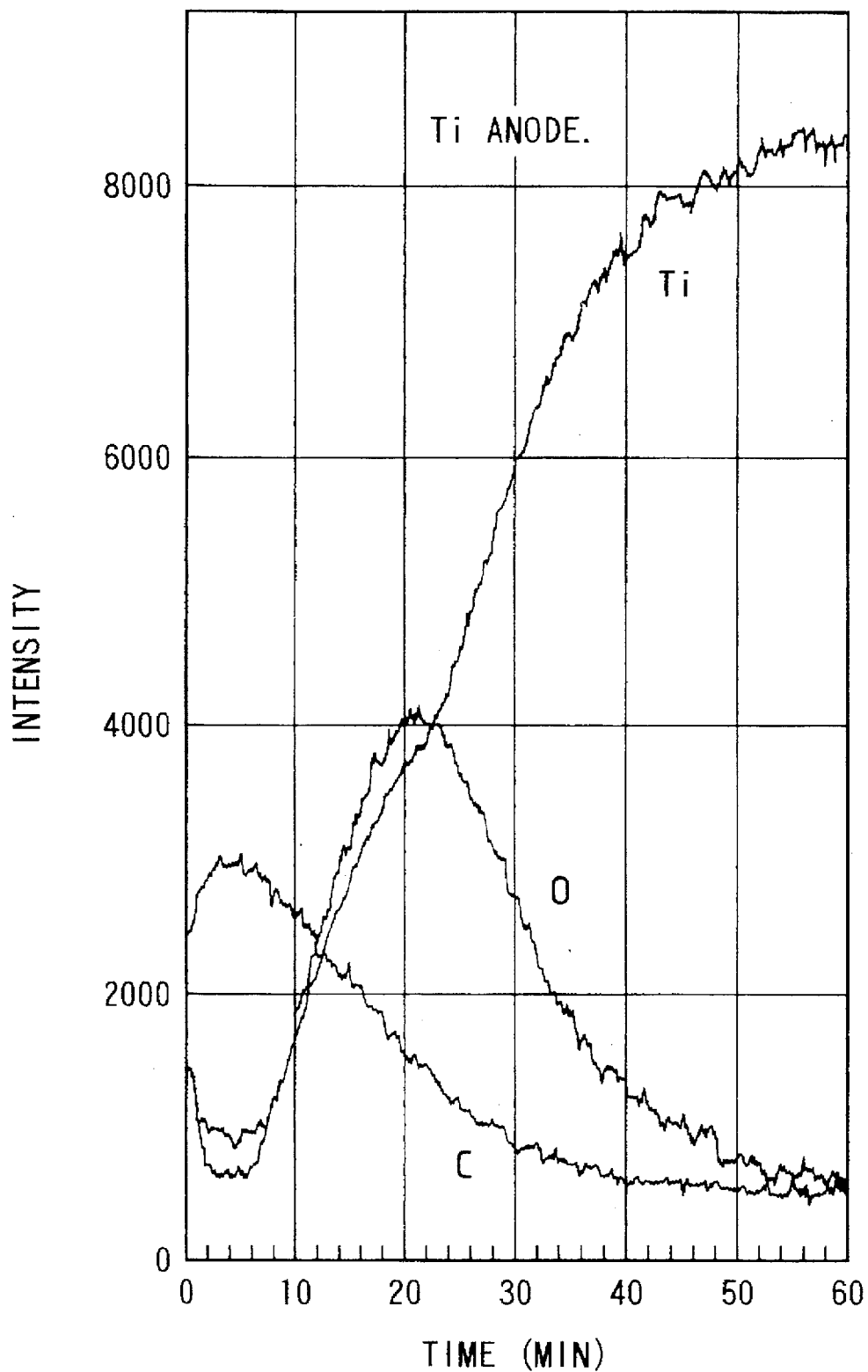
FIG. 9 is a chart obtained by the analysis by Auger electron spectroscopy (AES) of the anodized foil obtained in Example 18.

The above-obtained anodized foil according to the present invention was analyzed by Auger electron spectroscopy (AES). The results obtained are shown in FIG. 9, which indicates that the film contained a relatively large amount of carbon attributable to maleate anions.

EXAMPLES 19 TO 21

Anodized foils were obtained by anodizing a titanium foil having a smooth surface under the same conditions as in Example 18, except that the forming electrolyte was changed. The forming electrolyte used were: a 1-mol/l solution of tetraethylammoniumhydrogen adipate in γ-butyrolactone, with a water amount of 0.005 g/cm$^2$ (Example 19); a 10 wt % solution of ammonium adipate in ethylene glycol, with a water amount of 0.02 g/cm$^2$ (Example 20); and a 1-mol/l solution of triethylammonium salicylate in propylene carbonate, with a water amount of 0.003 g/cm$^2$ (Example 21).

The improvement ratio and relative permittivity for each oxide film were calculated in the same manner as in Example 18. The results obtained are shown in Table 3.

EXAMPLE 22

The same experiment as in Example 18 was carried out, except that a tantalum foil was used in place of the titanium foil. The improvement ratio and relative permittivity for the resulting oxide film were calculated. The results obtained are shown in Table 3.

Figure 10:
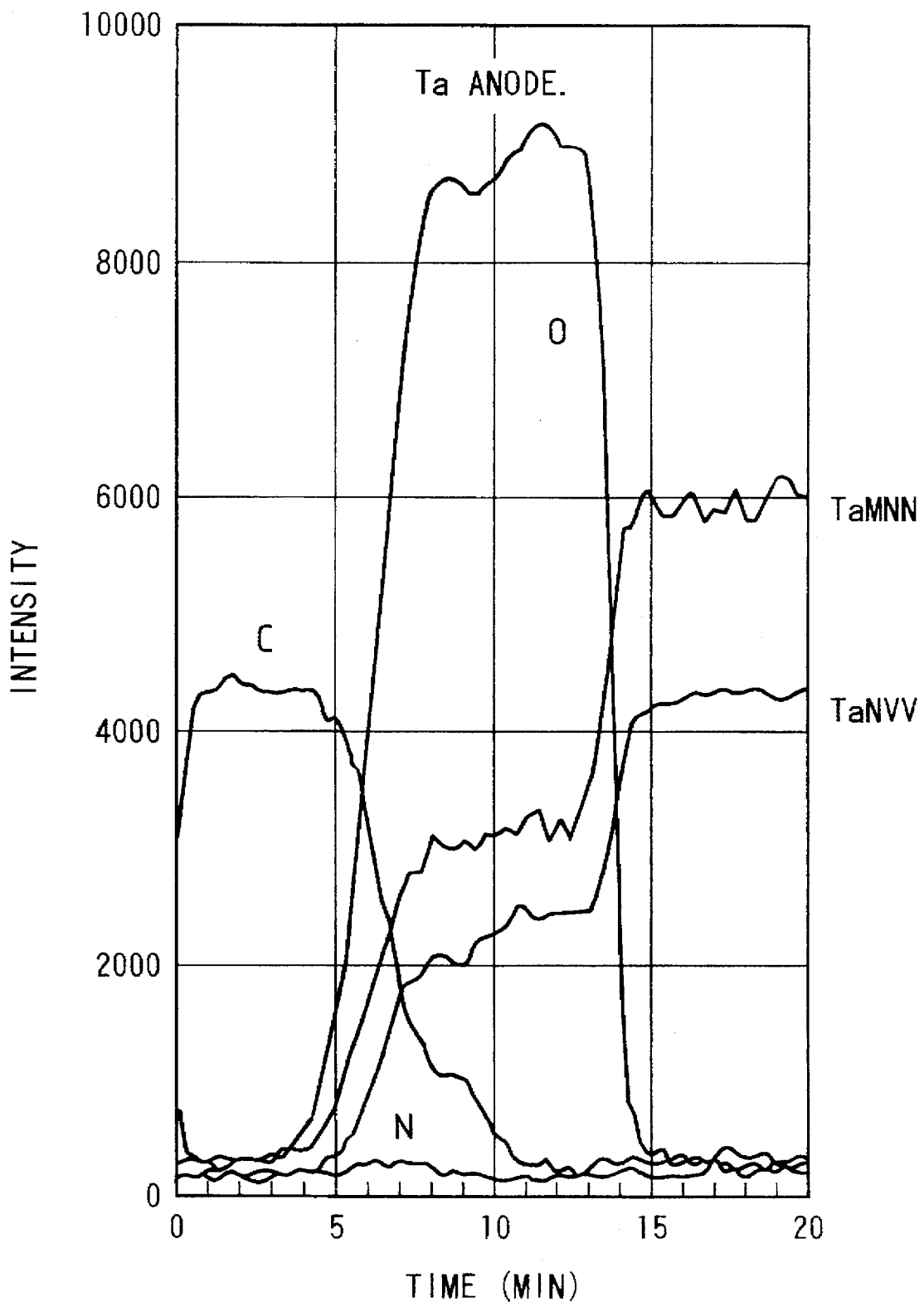
FIG. 10 is a chart obtained by the analysis by Auger electron spectroscopy (AES) of the anodized foil obtained in Example 22.

The thus-obtained anodized foil was analyzed by AES. The results obtained are shown in FIG. 10, which indicates that the film contained a relatively large amount of carbon attributable to maleate anions.

EXAMPLES 23 TO 25

The same experiment as in Example 18 was carried out, except that a zirconium foil (Example 23), a hafnium foil (Example 24), or a niobium foil (Example 25) was used in place of the titanium foil. The improvement ratio and relative permittivity for each resulting oxide film were calculated. The results obtained are shown in Table 3.

EXAMPLE 26

A 1-mol/l tetraethylammonium vanadate solution in ethylene glycol was dehydrated by heating under reduced pressure. This dehydrated electrolytic solution had a water concentration of 1.5% by weight. Into a cylindrical aluminum vessel having an inner diameter of 4 cm was introduced 100 ml of the electrolytic solution inside a glove box. A titanium foil having a smooth surface with a size of 1 cm by 1 cm was anodized to 50 V at a constant current of 5 mA/cm$^2$ in the vessel to obtain an anodized foil (the water amount in this electrolytic solution was about 0.75 g per cm$^2$ of the electrode).

Using a 10 wt % aqueous solution of ammonium adipate as a forming electrolyte, anodization was conducted in the same manner. Thus, an anodized foil having a conventional oxide film was also obtained.

Each of the thus-obtained anodized foils was immersed in a 10 wt % aqueous solution of ammonium adipate to measure the electrostatic capacity of the oxide film with an LCR meter at 120 Hz. As a result, the electrostatic capacity of the film according to this invention was 4.4 times the electrostatic capacity of the conventional film. This improvement ratio is equal to the ratio of the relative permittivity of the oxide film of this invention to that of the conventional oxide film, based on the assumption that the two films have the same thickness and the same surface area. Consequently, from the relative permittivity, 40, of the conventional oxide film, the relative permittivity of the oxide film of this invention was calculated at 180. The results obtained are shown in Table 4.

EXAMPLE 27

An anodized foil was obtained by anodizing a titanium foil having a smooth surface under the same conditions as in Example 26, except that an ethylene glycol solution (water amount, 0.01 g/cm$^2$) containing tetraethylammonium nitrate at a concentration of 1 mol/l was used in place of the forming electrolyte used in Example 26, and that the formation voltage was changed to 10 V. The improvement ratio and relative permittivity for the resulting oxide film were calculated in the same manner as in Example 26. The results obtained are shown in Table 4.

EXAMPLE 28

The same experiment as in Example 26 was carried out, except that a tantalum foil was used in place of the titanium foil, and that an ethylene glycol solution (water amount, 0.003 g/cm$^2$) containing tetraethylammoniumnitrate at a concentration of 1 mol/l was used as an electrolytic solution. The improvement ratio and relative permittivity for the resulting oxide film were calculated. The results obtained are shown in Table 4.

EXAMPLES 29 TO 31

The same experiment as in Example 26 was carried out, except that a zirconium foil (Example 29), a hafnium foil (Example 30), or a niobium foil (Example 31) was used in place of the titanium foil. The improvement ratio and relative permittivity for each resulting oxide film were calculated. The results obtained are shown in Table 4.

EXAMPLES 32 AND 33

Anodized foils were obtained by anodizing a zirconium foil having a smooth surface under the same conditions as in Example 29, except that the forming electrolyte was changed. The electrolytic solutions used were: a 1-mol/l solution of tetraethylammonium tungstate in ethylene glycol, with a water amount of 0.5 g/cm$^2$ (Example 32); and a 1-mol/l solution of tetraethylammoniumphosphate in ethylene glycol, with a water amount of 0.02 g/cm$^2$ (Example 33).

The improvement ratio and relative permittivity for each oxide film were calculated in the same manner as in Example 29. The results obtained are shown in Table 4.

EXAMPLE 34

A γ-butyrolactone solution containing triethylmethylammonium hydrogen maleate at a concentration of 1 mol/l was dehydrated by heating under reduced pressure. This dehydrated electrolytic solution had a water concentration of about 60 ppm. Into a cylindrical aluminum vessel having an inner diameter of 4 cm was introduced 100 ml of the electrolytic solution inside a glove box. A 4N etched aluminum foil with dimensions of 3.1 cm by 0.7 cm and a thickness of 100 μm was anodized to 50 V at a constant current of 50 mA/cm$^2$ in the vessel to obtain an anodized etched foil (the water amount in this electrolytic solution was about 0.0014 g per cm$^2$ of the electrode). The anodized foil obtained was immersed in a 10 wt % aqueous solution of ammonium adipate to measure the electrostatic capacity of the oxide film with an LCR meter at 120 Hz. As a result, the electrostatic capacity of the film was found to be 288 μF/cm$^2$.

This anodized foil was used as an anode in combination with an etched aluminum foil as a cathode and manila paper as a separator to fabricate a rolled capacitor element. This capacitor element was impregnated with a 25 wt % solution of triethylmethylammonium hydrogen maleate in γ-butyrolactone as an electrolytic solution to produce an aluminum electrolytic capacitor sample having a case size of 5 φ (diameter)×11 l (length) and a nominal voltage of 35 V. The electrostatic capacity of this capacitor at 120 Hz was 352 μF.

COMPARATIVE EXAMPLE 3

Using a 10 wt % aqueous ammonium adipate solution as a forming electrolyte, an etched aluminum foil was anodized in the same manner as in Example 34. The anodized foil obtained had an electrostatic capacity of 11 μF/cm$^2$. An aluminum electrolytic capacitor sample was produced in the same manner as in Example 34, except that the thus-obtained anodized foil was used as an anode. The electrostatic capacity of this capacitor at 120 Hz was 45 μF.

EXAMPLE 35

An anode foil was produced under the same conditions as in Example 34, except that a 4N etched aluminum foil with dimensions of 1 cm by 0.5 cm and a thickness of 100 μm was used. This anode foil was immersed alternately in an ethanol solution of pyrrole and an aqueous ammonium persulfate solution to cause chemical oxidative polymerization to thereby form a precursor film. Using this chemical polymerization film as an electrode, electrolytic polymerization was conducted in a solution containing pyrrole and a supporting electrolyte to form a polypyrrole film. A carbon and silver paste were applied to the polypyrrole film to produce an aluminum solid electrolytic capacitor sample. The electrostatic capacity of this capacitor at 120 Hz was 49 μF.

COMPARATIVE EXAMPLE 4

Using a 10 wt % aqueous ammonium adipate solution as a forming electrolyte, an etched aluminum foil was anodized in the same manner as in Example 35. An aluminum solid electrolytic capacitor sample was produced in the same manner as in Example 35, except that the thus-obtained anodized foil was used as an anode. The electrostatic capacity of this capacitor at 120 Hz was 5 μF.

EXAMPLE 36

An anode foil was produced under the same conditions as in Example 34, except that a 4N etched aluminum foil with dimensions of 0.5 cm by 0.2 cm and a thickness of 100 μm was used. This anode foil was placed in an aluminum cup having a size of 5 φ×7 l together with N-butylisoquinolinium (TCNQ)$_2$, and the salt was melted by heating and then solidified by quenching. Thus, an aluminum solid electrolytic capacitor sample was produced. The electrostatic capacity of this capacitor at 120 Hz was 23 μF.

COMPARATIVE EXAMPLE 5

Using a 10 wt % aqueous ammonium adipate solution as a forming electrolyte, an etched aluminum foil was anodized in the same manner as in Example 36. An aluminum solid electrolytic capacitor sample was produced in the same manner as in Example 36, except that the thus-obtained anodized foil was used as an anode. The electrostatic capacity of this capacitor at 120 Hz was 2 μF.

EXAMPLE 37

A thin aluminum film having a thickness of about 1.5 μm was formed on a glass substrate by sputtering. Part (2 cm by 2.4 cm) of this thin film was anodized under the same conditions as in Example 34, except that the current density was changed to 5 mA/cm$^2$. A gold layer having a thickness of about 80 nm was formed on the resulting oxide film by vapor deposition to produce an MIM device having a size of 1 mm by 1 mm. The electrostatic capacity of this MIM capacitor at 120 Hz was 5 nF.

COMPARATIVE EXAMPLE 6

An MIM device sample was produced in the same manner as in Example 37, except that a 10 wt % aqueous ammonium adipate solution was used as a forming electrolyte. The electrostatic capacity of this MIM capacitor at 120 Hz was 0.5 nF.

EXAMPLE 38

A thin tantalum film having a thickness of about 2 μm was formed on a glass substrate by sputtering. Using this thin film, an MIM device sample having dimensions of 1 mm by 1 mm was produced in the same manner as in Example 37. The electrostatic capacity of this MIM capacitor at 120 Hz was 5 nF.

Figure 11:
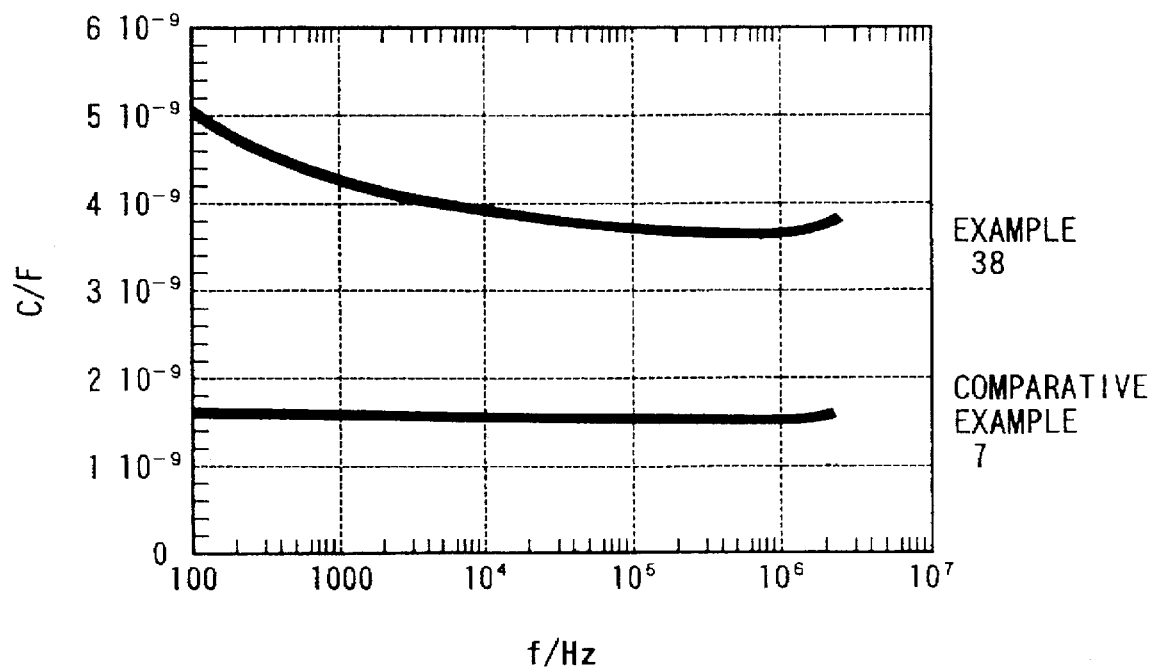
FIG. 11 is a graph showing the frequency dependence of the electrostatic capacity of each of the MIM device obtained in Example 38 and that obtained in Comparative Example 7.

In FIG. 11 is shown the frequency dependence of the electrostatic capacity of this MIM capacitor.

COMPARATIVE EXAMPLE 7

An MIM device sample was produced in the same manner as in Example 38, except that a 10 wt % aqueous ammonium adipate solution was used as a forming electrolyte. The electrostatic capacity of this MIM capacitor at 120 Hz was 1.5 nF.

The frequency dependence of the electrostatic capacity of this MIM capacitor is shown in FIG. 11.

The high-permittivity composite oxide film of the present invention has a relative permittivity at least twice the relative permittivity of the conventional simple oxide film formed with a water-based electrolytic solution. By use of the high-permittivity composite oxide film of this invention, it is possible to realize a capacitor device having the same size and a larger electrostatic capacity or having the same electrostatic capacity and a smaller size.

TABLE 1

| Example No. | Valve metal | Forming electrolyte | Formation voltage (V) | Relative permittivity |
|---|---|---|---|---|
| Example 1 | Al | 1M-triethylmethylammonium hydrogen maleate/GBL | 75 | 270 |
| Example 2 | Al | 1M-tetraethylammonium hydrogen citraconate/GBL | 75 | 190 |
| Example 3 | Al | 0.1M-tetraethylammonium hydrogen oxalate/GBL | 75 | 30 |
| Example 4 | Al | 1M-tetraethylammonium hydrogen malonate/GBL | 75 | 130 |
| Example 5 | Al | 0.5M-tetraethylammonium hydrogen succinate/GBL | 75 | 70 |
| Example 6 | Al | 1M-tetraethylammonium hydrogen glutarate/GBL | 75 | 230 |
| Example 7 | Al | 1M-tetraethylammonium hydrogen adipate/GBL | 75 | 200 |
| Example 8 | Al | 1M-tetraethylammonium salicylate/GBL | 75 | 170 |
| Example 9 | Al | 1M-tetraethylammonium hydrogen maleate/PC | 75 | 180 |
| Example 10 | Al | 1M-ammonium hydrogen maleate/EG | 75 | 180 |
| Example 11 | Al | 1M-tetraethylammonium salicylate/PC | 50 | 120 |
| Comparative Example 1 | Al | 10 wt %-ammonium adipate/water | 75 | 11 |

TABLE 2

| Example No. | Valve metal | Forming electrolyte | Formation voltage (V) | Relative permittivity |
|---|---|---|---|---|
| Example 12 | Al | 1M-tetraethylammonium vanadate/EG | 60 | 100 |
| Example 13 | Al | 1M-tetraethylammonium nitrate/EG | 50 | 90 |
| Example 14 | Al | 1M-tetraethylammonium borate/EG | 38 | 80 |
| Example 15 | Al | 1M-tetraethylammonium phosphate/EG | 25 | 70 |
| Example 16 | Al | 1M-tetraethylammonium chromate/EG | 75 | 35 |
| Example 17 | Al | 1M-tetraethylammonium tungstate/EG | 30 | 30 |
| Comparative Example 2 | Al | 1M-tetraethylammonium vanadate/water | 50 | 11 |

TABLE 3

| Example No. | Valve metal | Forming electrolyte | Formation voltage (V) | Improvement ratio | Relative permittivity |
|---|---|---|---|---|---|
| Example 18 | Ti | 1M-triethylmethylammonium hydrogen maleate/GBL | 50 | 3.4 | 140 |
| Example 19 | Ti | 1M-tetraethylammonium hydrogen adipate/GBL | 50 | 2.5 | 100 |
| Example 20 | Ti | 10 wt %-ammonium adipate/EG | 50 | 3.7 | 150 |
| Example 21 | Ti | 1M-triethylammonium salicylate/PC | 50 | 4.2 | 170 |
| Example 22 | Ta | 1M-triethylmethylammonium hydrogen maleate/GBL | 50 | 3.5 | 100 |
| Example 23 | Zr | 1M-triethylmethylammonium hydrogen maleate/GBL | 50 | 11.6 | 290 |
| Example 24 | Hf | 1M-triethylmethylammonium hydrogen maleate/GBL | 50 | 5.8 | 130 |
| Example 25 | Nb | 1M-triethylmethylammonium hydrogen maleate/GBL | 50 | 6.3 | 260 |

TABLE 4

| Example No. | Valve metal | Forming electrolyte | Formation voltage (V) | Improvement ratio | Relative permittivity |
|---|---|---|---|---|---|
| Example 26 | Ti | 1M-tetraethylammonium vanadate/EG | 50 | 4.4 | 180 |
| Example 27 | Ti | 1M-tetraethylammonium nitrate/EG | 10 | 3.0 | 120 |
| Example 28 | Ta | 1M-tetraethylammonium nitrate/EG | 50 | 8.3 | 230 |
| Example 29 | Zr | 1M-tetraethylammonium vanadate/EG | 50 | 3.6 | 90 |
| Example 30 | Hf | 1M-tetraethylammonium vanadate/EG | 50 | 2.9 | 60 |
| Example 31 | Nb | 1M-tetraethylammonium vanadate/EG | 50 | 3.7 | 150 |
| Example 32 | Zr | 1M-tetraethylammonium tungstate/EG | 50 | 2.9 | 70 |
| Example 33 | Zr | 1M-tetraethylammonium phosphate/EG | 50 | 2.5 | 60 |

While the invention has been described in detail and with reference to specific embodiments thereof, it will be apparent to one skilled in the art that various changes and modifications can be made therein without departing from the spirit and scope thereof.

What is claimed is:

1. A composite oxide film formed on a substrate and which comprises at least one oxide of a metal selected from the group consisting of Al, Ti, Zr, Hf, Nb, and Ta, said oxide containing anions of at least one member selected from the group consisting of organic carboxylic acid salts and inorganic oxoacid salts.

2. The composite oxide film as claimed in claim 1, which has a relative permittivity at least twice the relative permittivity of the simple oxide of said metal.

3. The composite oxide film as claimed in claim 1, which has a relative permittivity at least 2.5 times the relative permittivity of the simple oxide of said metal.

4. The composite oxide film as claimed in claim 1, which is a composite aluminum oxide film having a relative permittivity of from 22 to 1,000 and having an acid salt anion content of from 1 to 50% by weight based on the content of the central element of said anions of an organic carboxylic acid salt or inorganic oxoacid salt.

5. The composite oxide film as claimed in claim 1, which is a composite titanium oxide film having a relative permittivity of from 80 to 1,000 and having an acid salt anion content of from 1 to 50% by weight based on the content of the central element of said anions of an organic carboxylic acid salt or inorganic oxoacid salt.

6. The composite oxide film as claimed in claim 1, which is a composite zirconium oxide film having a relative permittivity of from 50 to 1,000 and having an acid salt anion content of from 1 to 50% by weight based on the content of the central element of said anions of an organic carboxylic acid salt or inorganic oxoacid salt.

7. The composite oxide film as claimed in claim 1, which is a composite hafnium oxide film having a relative permittivity of from 44 to 1,000 and having an acid salt anion content of from 1 to 50% by weight based on the content of the central element of said anions of an organic carboxylic acid salt or inorganic oxoacid salt.

8. The composite oxide film as claimed in claim 1, which is a composite niobium oxide film having a relative permittivity of from 82 to 1,000 and having an acid salt anion content of from 1 to 50% by weight based on the content of the central element of said anions of an organic carboxylic acid salt or inorganic oxoacid salt.

9. The composite oxide film as claimed in claim 1, which is a composite tantalum oxide film having a relative permittivity of from 56 to 1,000 and having an acid salt anion content of from 1 to 50% by weight based on the content of the central element of said anions of an organic carboxylic acid salt or inorganic oxoacid salt.

10. The composite oxide film as claimed in claim 1, wherein said organic carboxylic acid salt is at least one salt of an organic acid selected from the group consisting of maleic acid, citraconic acid, oxalic acid, malonic acid, succinic acid, adipic acid, and salicylic acid.

11. The composite oxide film as claimed in claim 1, wherein said inorganic oxoacid salt is at least one salt of an oxoacid selected from the group consisting of nitric acid, phosphoric acid, boric acid, vanadic acid, chromic acid, molybdic acid, and tungstic acid.

12. An electrolytic capacitor containing a dielectric and an electrolytic solution, said dielectric being the composite oxide film as claimed in claim 1.

13. A solid electrolytic capacitor containing a dielectric and a solid electrolyte, said dielectric being the composite oxide film as claimed in claim 1.

14. A thin-film capacitor containing as a dielectric the composite oxide film as claimed in claim 1.

15. A semiconductor memory (DRAM) containing as a dielectric the composite oxide film as claimed in claim 1.

16. A thin-film transistor liquid-crystal device (TFT-LCD) containing as a dielectric the composite oxide film as claimed in claim 1.

17. A wiring/electrode insulating film comprising as an insulator the composite oxide film as claimed in claim 1.

18. A metal-insulator-metal (MIM) device containing as the insulator the composite oxide film as claimed in claim 1.

* * * * *